United States Patent [19]
Krauz et al.

[11] Patent Number: 5,525,541
[45] Date of Patent: Jun. 11, 1996

[54] METHOD OF MAKING AN ELECTRONIC AND/OR PHOTONIC COMPONENT

[75] Inventors: Philippe Krauz, Creteil; Elchuri K. Rao, Issy-Les-Moulineaux, both of France

[73] Assignee: France Telecom, Paris, France

[21] Appl. No.: 380,030

[22] Filed: Jan. 30, 1995

[30] Foreign Application Priority Data

Jan. 31, 1994 [FR] France ............................ 94 01011

[51] Int. Cl.$^6$ ................................................. H01L 21/225
[52] U.S. Cl. .................... 437/161; 437/133; 148/DIG. 72
[58] Field of Search ................................... 437/110, 129, 437/133, 161, 969; 148/DIG. 67, DIG. 69

[56] References Cited

U.S. PATENT DOCUMENTS

| | | | |
|---|---|---|---|
| 4,897,361 | 1/1990 | Harriott et al. | 148/DIG. 72 |
| 5,204,284 | 4/1993 | Kuo et al. | 437/133 |
| 5,217,539 | 6/1993 | Fraas et al. | 437/161 |
| 5,298,454 | 3/1994 | D'Asaro et al. | 437/133 |

OTHER PUBLICATIONS

Journal of Applied Physics, vol. 66, No. 2, Jul. 15, 1989, pp. 482–487.
Journal Of Applied Physics, vol. 68, No. 12, Dec. 1990, pp. 6174–6178.
Applied Physics Letters, vol. 62, No. 6, Feb. 8, 1993, pp. 556–558.
Applied Physics Letters, vol. 55, No. 7, Aug. 14, 1989, pp. 672–674.
Applied Physics Letters, vol. 53, No. 19, Nov. 7, 1988, pp. 1859–1861.
Japanese Journal Of Applied Physics, vol. 30, No. 6A, Jun. 1991, pp. L1018–L1020.
17TH International Symposium On Gallium Arsenide and Related Compounds, Sep. 24, 1990, pp. 281–286.
Electronics Letters, vol. 20, No. 9, Apr. 26, 1984, pp. 383–384.

*Primary Examiner*—Chandra Chaudhari
*Attorney, Agent, or Firm*—Blakely, Sokoloff, Taylor & Zafman

[57] ABSTRACT

A method of making a component presenting at least one integrated electro-optical and/or photonic function, in which at least one dielectric layer of doped $SiO_x$ is deposited on a quantum well layer based on III/V materials, and in which the resulting sample is heat treated. The thickness of said dielectric layer, the nature of the dopant [isoelectronic, activating or blocking, and/or electronically active of n-type or of p_type], and the concentration of the doping, and also the conditions of heat treatment, in such a manner as to confer the desired electro-optical and/or photonic properties to the component.

11 Claims, 6 Drawing Sheets

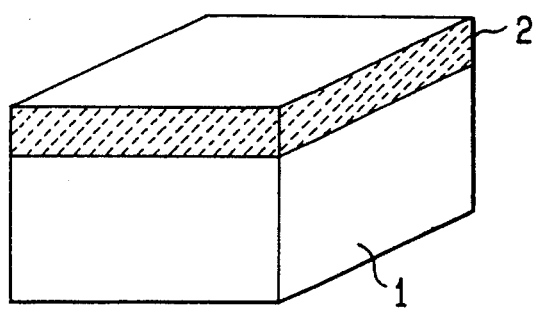
FIG_1a
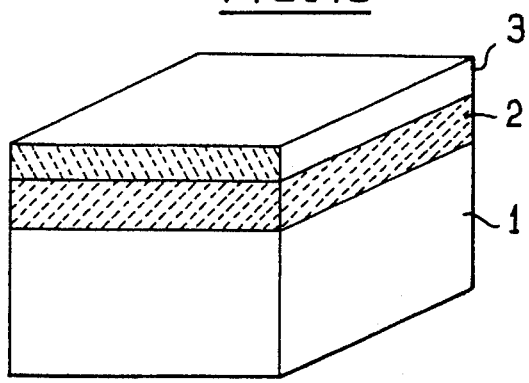
FIG_1b
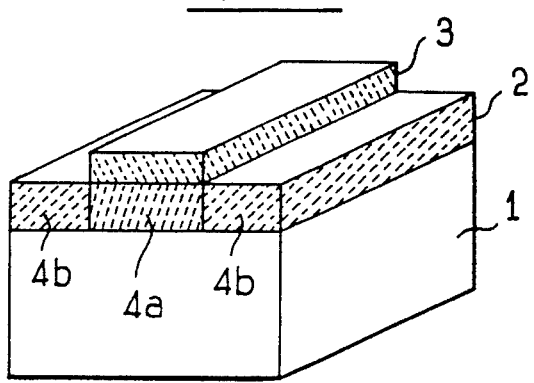
FIG_1c
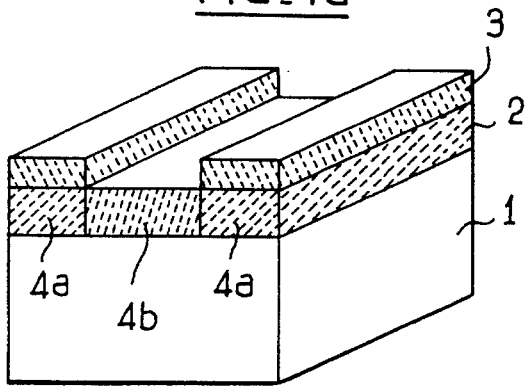
FIG_1d
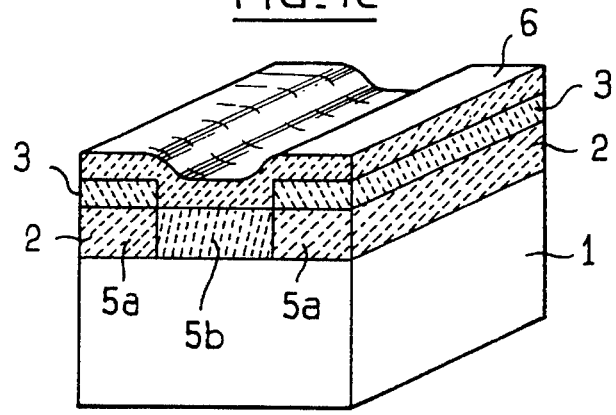
FIG_1e

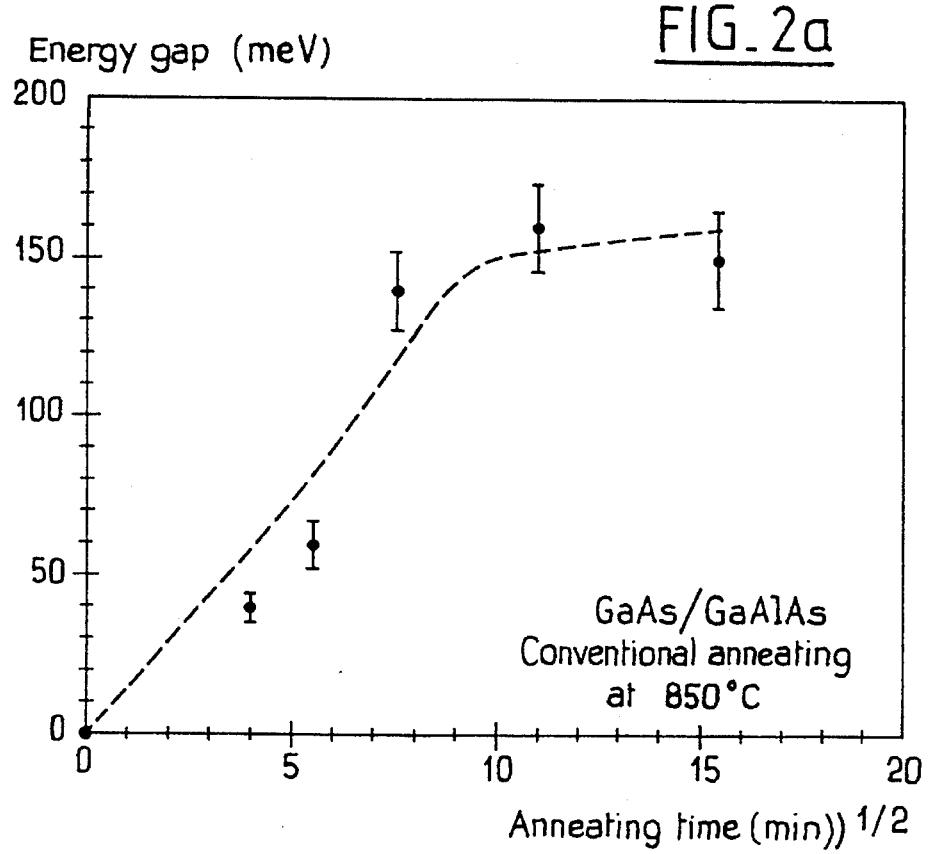
FIG._2a
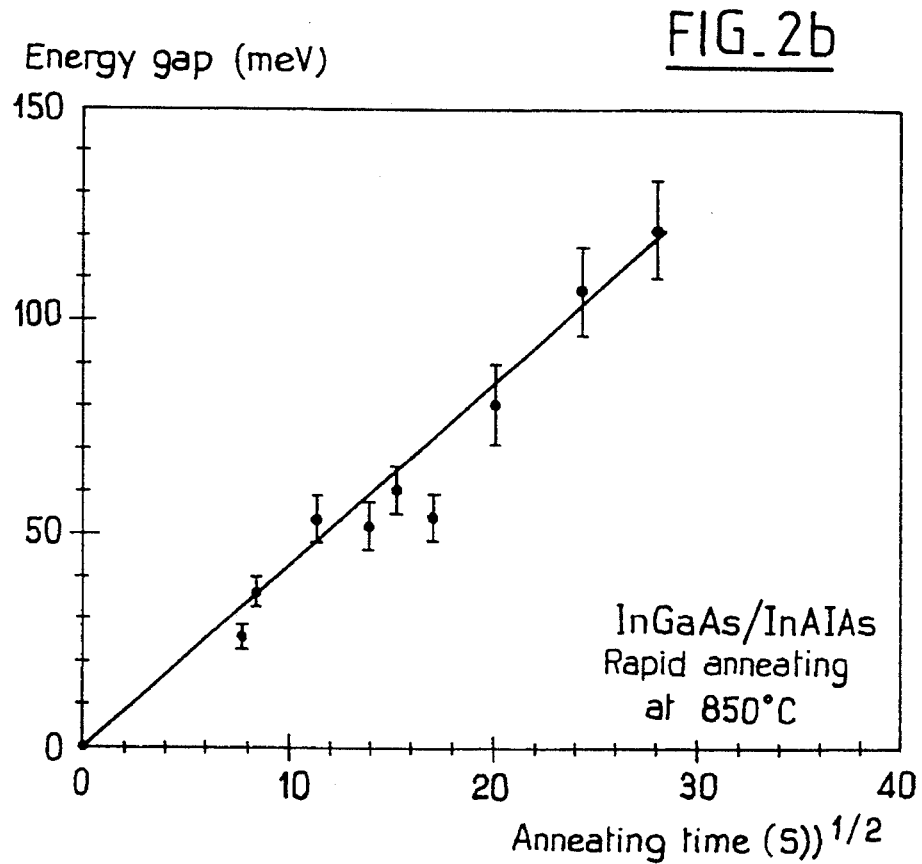
FIG._2b

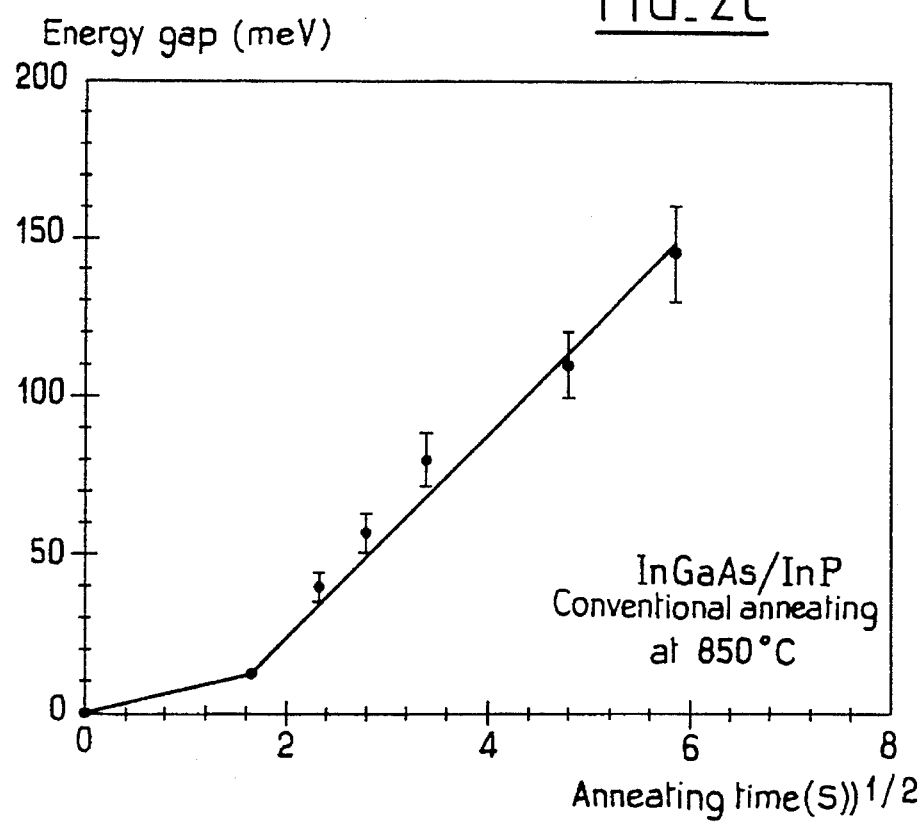
FIG_2c
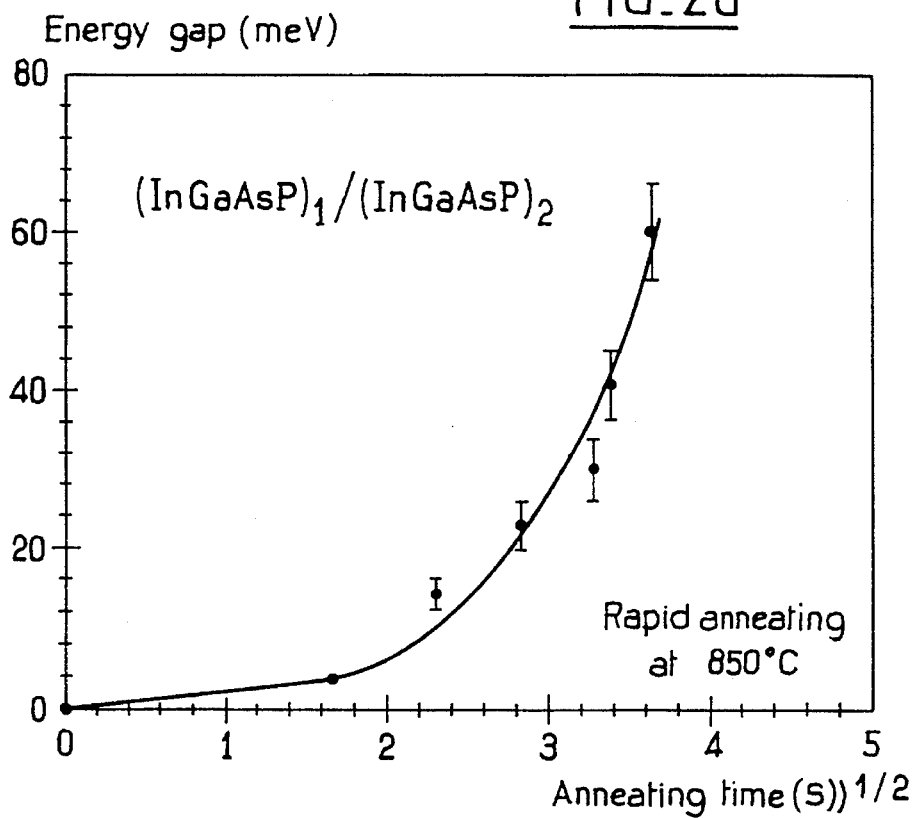
FIG_2d

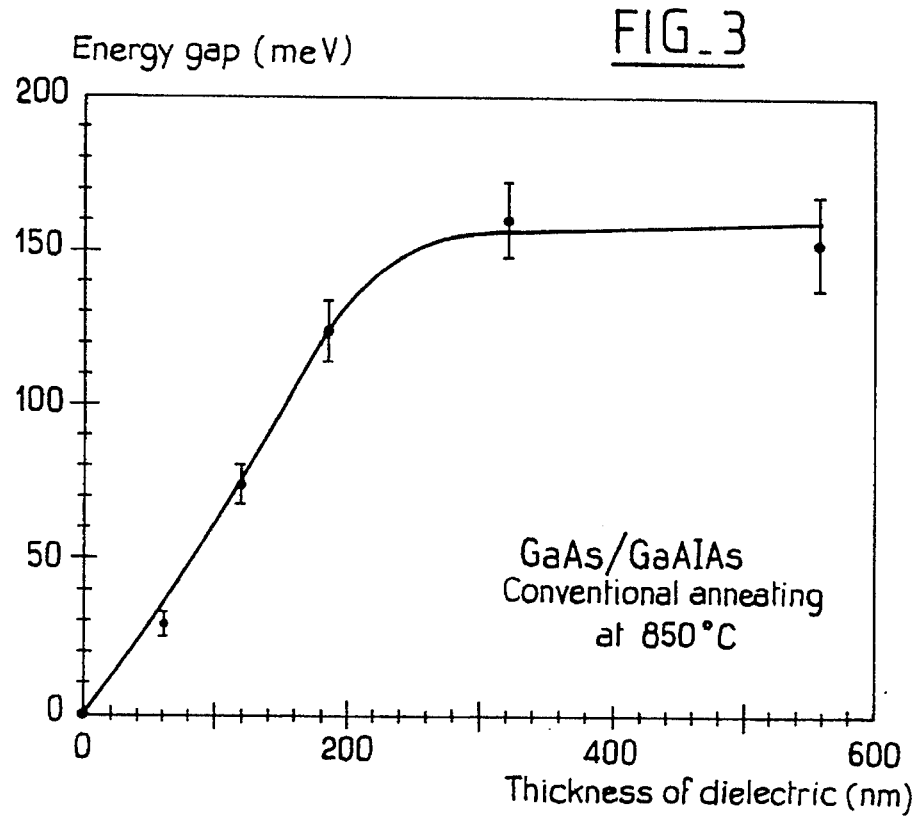
FIG_3
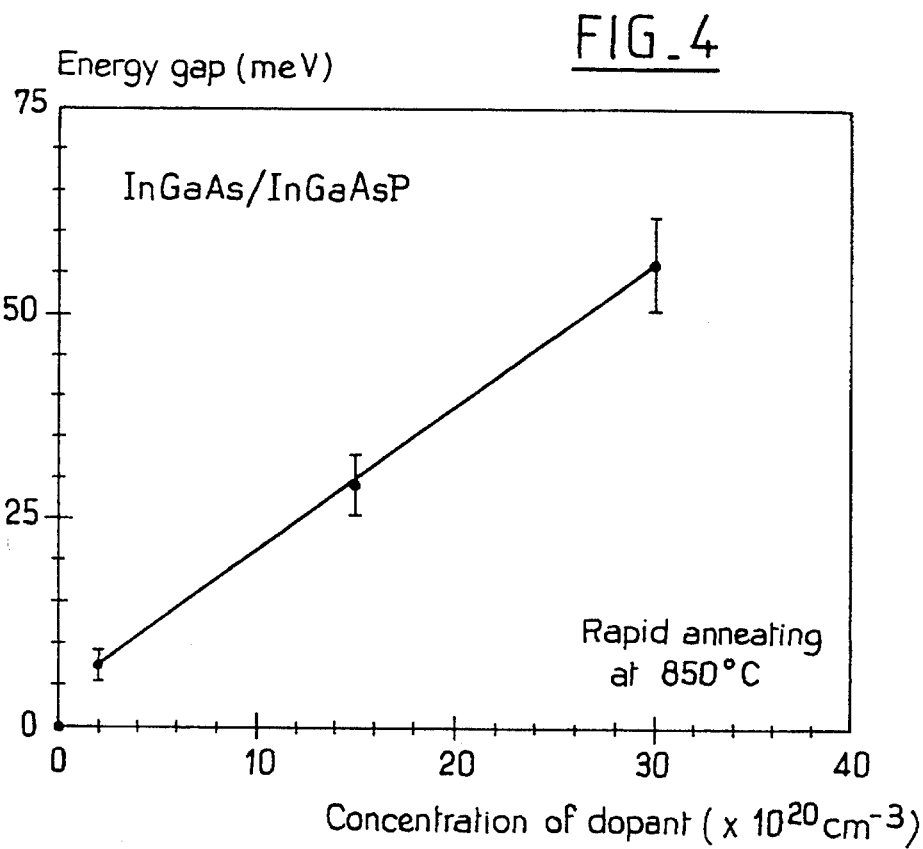
FIG_4

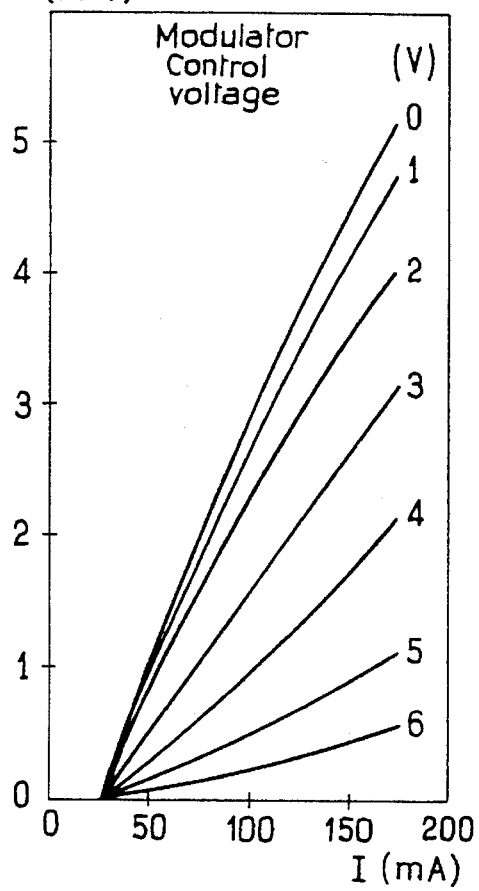
FIG_8
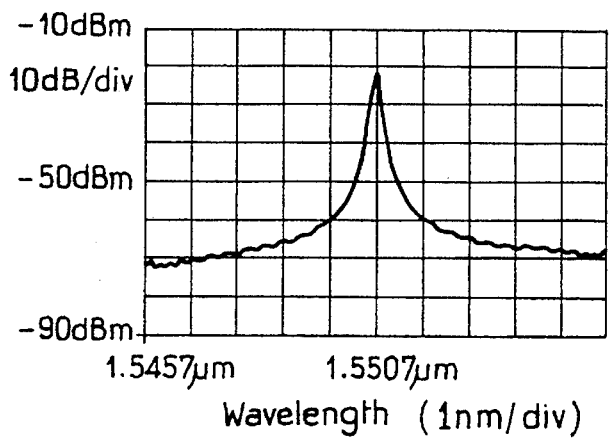
FIG_7
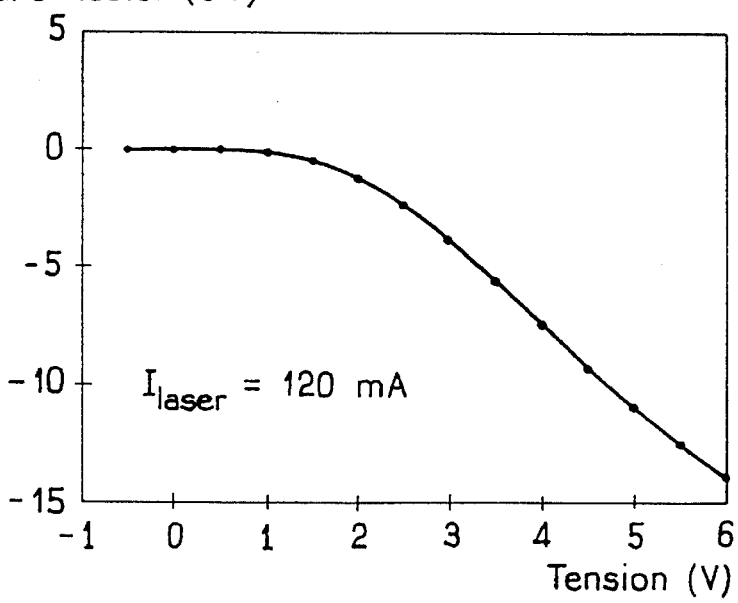
FIG_9

5,525,541

METHOD OF MAKING AN ELECTRONIC AND/OR PHOTONIC COMPONENT

The present invention relates to a method of making components having electronic and/or photonic function(s), on the basis of quantum well heterostructures based on III/V materials such as GaAs and InP.

BACKGROUND OF THE INVENTION

It is known that it is possible, with or without inserting free carriers, to modify locally the forbidden band energies and the refractive indices of such heterostructures by techniques of interdiffusion or of alloy disordering. Such modifications of forbidden band energies and of refractive indices give rise to modifications to the electro-optical properties of the heterostructures, and make it possible to provide various electro-optical and/or photonic functions that may be active (laser, modulator, etc.) or passive (waveguide, directional coupler, etc.).

Of the techniques most widely in use at present, mention may be made of the techniques of thermal diffusion or of ion implantation, and also of techniques of depositing dielectric layers.

In the thermal diffusion technique, disorder is created or the opto-electronic properties of the heterostructure are transformed by inserting an n-type electrically active element such as silicon (Si) or sulfur (S), or by inserting a p-type element such as zinc (Zn) for example. Insertion is obtained after heat treatment that induces diffusion of the element which is either deposited directly on the surface, or which makes contact with the surface as a vapor at the heat treatment temperature. For examples of applications of that technique, reference may advantageously be made to the following various publications:

Low-threshold InGaAs/GaAs/AlGaAs quantum well laser with an intracavity optical modulator by impurity-induced disordering; W. X. Zou et al., Applied Physics Letters, 62 (6), 1993, pp. 556–558;

Impurity-induced layer disordering in In(AlGa)P-InGaP quantum well heterostructures: visible spectrum buried heterostructure lasers; J. M. Dallesasse et al., Journal of Applied Physics Letters, 66 (2), 1989, pp. 482–487;

GaAlAs buried multiquantum well lasers fabricated by diffusion-induced disordering; Tadashi Fukuzawa, Shigeru Semura, Hiroshi Saito, Tsuneaki Ohta, Yoko Uchida, and Hisao Nakashima; Appl. Phys. Lett. 45 (1), Jul. 1, 1984, pp. 1–3; and Fabrication of GaAlAs "window-strip" multi-quantum-well heterostructure lasers using Zn diffusion-induced alloying; Y. Suzuki, Y. Horikoshi, M. Kobayashi, H. Okamoto, Electronics Letters, Apr. 26, 1984, Vol. 20, No. 9, pp. 383–384.

That technique nevertheless suffers from the drawback of being usable only when it is desired to obtain transformed regions that are electrically doped, i.e. with the presence of n-type or p-type free carriers.

In particular, it will be observed that in the above-mentioned article by J. M. Dallesasse et al., the layer which is deposited on the quantum well structure is a layer of Si and not a layer of doped $SiO_2$. The layer of doped $SiO_2$ that is mentioned is a layer that encapsulates the sample constituted by the quantum well layer and the Si layer.

The layer of doped $SiO_2$ therefore does not intervene directly in the modification of the energy levels of the quantum well heterostructure; it is the diffusion of Si in the heterostructure that gives rise to disordering and to the transformation of the opto-electronic properties thereof.

The diffusion of silicon inserts free carriers into the disordered or modified region.

In the ion implantation technique, a mask is placed on the surface of the heterostructure to define regions that are to be modified locally, and bombardment is then performed using the ions that are to be implanted. The heterostructure is then subjected to heat treatment.

In this respect, reference may advantageously be made to the following two publications:

Quantum well laser with integrated passive waveguide fabrication by neutral impurity disordering; S. R. Andrew et al., IEEE Photonics Technology Letters, Vol. 4, No. 5, 1992, pp. 426–428; and Large blueshifting of InGaAs/InP quantum well band gaps by ion implantation; J. E. Zucker et al., Applied Physics Letters, 60 (4), 1992, pp. 3036–3038.

Although ion implantation makes it possible to transform the heterostructure with or without inserting free carriers into the transformed region, that technique causes residual defects to appear in the transformed regions of the heterostructure, which defects are difficult to eliminate. As a result, ion implantation techniques have so far been used only for implementing passive functions.

Dielectric layer techniques consist in depositing dielectric layers such as $SiO_x$ or $Si_x$-$N_y$ · on quantum well heterostructures and then in heat treating the resulting samples to obtain transformation without inserting free carriers. In the case of quantum well heterostructures based on GaAs, for example, the heat treatment causes the gallium to be exodiffused into the $SiO_x$ dielectric, thereby generating Ga gaps in the dielectric-structure interface. Deep thermal diffusion of those gaps gives rise to the transformation of the quantum heterostructure.

For examples of applications of those techniques, reference may advantageously be made to the following various publications:

Monolithic waveguide coupled cavity lasers and modulators fabricated by impurity-induced disordering; Robert L. Thornton, et al., Journal of Lightwave Technology, Vol. 6, No. 6, 1988, pp. 786–792;

Integrated external cavity InGaAs/InP lasers using cap-annealing disordering; T. Miyazaza et al., IEEE Photonics Technology Letters, Vol. 3, No. 5, 1991, pp. 421–423;

Refractive index change of GaInAs/InP disordered superlattice waveguide; A. Wakatsuki et al., IEEE Photonics Technology Letters, Vol. 3, No. 10, 1991, pp. 905–907;

Monolithic integration of an (Al)GaAs laser and an intracavity electroabsorption modulator using selective partial interdiffusion; S. O'Brien et al., Applied Physics Letters, 58 (13), 1991, pp. 1363–1365; and Spatial control of quantum well intermixing in GaAs/GaAlAs using a one-step process; S. G. Ayling et al., Electronics Letters, Vol. 28, No. 24, 1992, pp. 2240–2241.

Because of the stresses at the interface between the dielectric and the quantum well heterostructure sample, that dielectric deposition technique is difficult to apply to reproducible fabrication of discrete or integrated components based on GaAs. With InP, it is not applicable in reproducible manner. Only one implementation is reported in the literature and it was obtained under particularly severe conditions of heat treatment by successive pulses of fast temperature rises.

OBJECTS AND SUMMARY OF THE INVENTION

The present invention proposes a method that is simple, reproducible, and universal, and which makes use of deposition of an $SiO_x$ type dielectric that has been adapted by modification of its phsyico-chemical structure.

This makes it possible to transform or to modify the opto-electronic properties of quantum well heterostructures based on III/V materials such as GaAs and InP (with or without inserting free carriers depending on operating requirements), for the purpose of making various different opto-electronic and photonic functions.

In addition, the method is cheap and easy to implement.

The present invention thus provides a method of making a component presenting at least one integrated electro-optical and/or photonic function, in which at least one dielectric layer is deposited on a quantum well layer based on III/V materials, and in which the resulting sample is heat treated.

According to the invention, the dielectric layer is a layer of doped $SiO_x$ where E lies in the range [0,2] (range between 0 and 2, 0 excluded, 2 included), and the thickness of said layer, the nature and the concentration of its doping, and the conditions of the heat treatment are selected in such a manner as to shift the forbidden band energy of that region of the quantum well layer on which the dielectric layer is deposited to confer on said region the electro-optical and/or photonic properties that correspond to said function.

The method of the invention is particularly remote from the method described in the above-cited article by J. M. Dallesasse et al., since in the method proposed in that article, the modification of the multi-quantum-wells results from the diffusion of silicon, which also inserts free carriers into the disordered or modified region.

With the method of the invention, the quantum well layer is interdiffused or modified without inserting free carriers.

It will also be observed that in the above-mentioned article, the deposit of phospho-silica-glass (PSG) plays no role in the interdiffusion or modification process. That deposit is made to inhibit or minimize decomposition of the phosphorus in the surface layer of the sample (InGaP or InAlP).

In the invention, the doping of the silica, e.g. phosphorous doping, is the key for obtaining interdiffusion or modification without the presence of free carriers.

The multi-quantum-well layer is modified and controlled by the presence of phosphorous doping, and/or by the thickness of the deposit.

BRIEF DESCRIPTION OF THE DRAWINGS

Other characteristics and advantages of the method appear further from the following description. The description is purely illustrative and non-limiting. It should be read with reference to the accompanying drawings, in which:

FIGS. 1a to 1e show the general manner in which the method of the invention is implemented;

FIGS. 2a to 2d are graphs showing the forbidden band energy shift that is obtained for four types of quantum well structure, plotted as a function of the square root of the duration of the heat treatment in the method illustrated in FIGS. 1a to 1e;

FIG. 3 is a graph showing the forbidden band energy shift that is obtained for a particular type of heterostructure, plotted as a function of the thickness of the doped dielectric deposited by the method illustrated in FIGS. 1a to 1e;

FIG. 4 is a graph showing the forbidden band energy shift that is obtained in another type of heterostructure, plotted as a function of the concentration of dopant in the deposited dielectric;

FIG. 7 is a graph showing the gain of the integrated laser as a function of wavelength;

FIG. 8 is a graph on which the various optical powers output by the modulator are plotted for different control voltages applied to the modulator in the FIG. 5 component; and FIG. 9 is a graph on which the optical transmission values of the integrated laser modulator of the FIG. 5 component are plotted as a function of the voltage applied thereto.

MORE DETAILED DESCRIPTION

Figure 5:
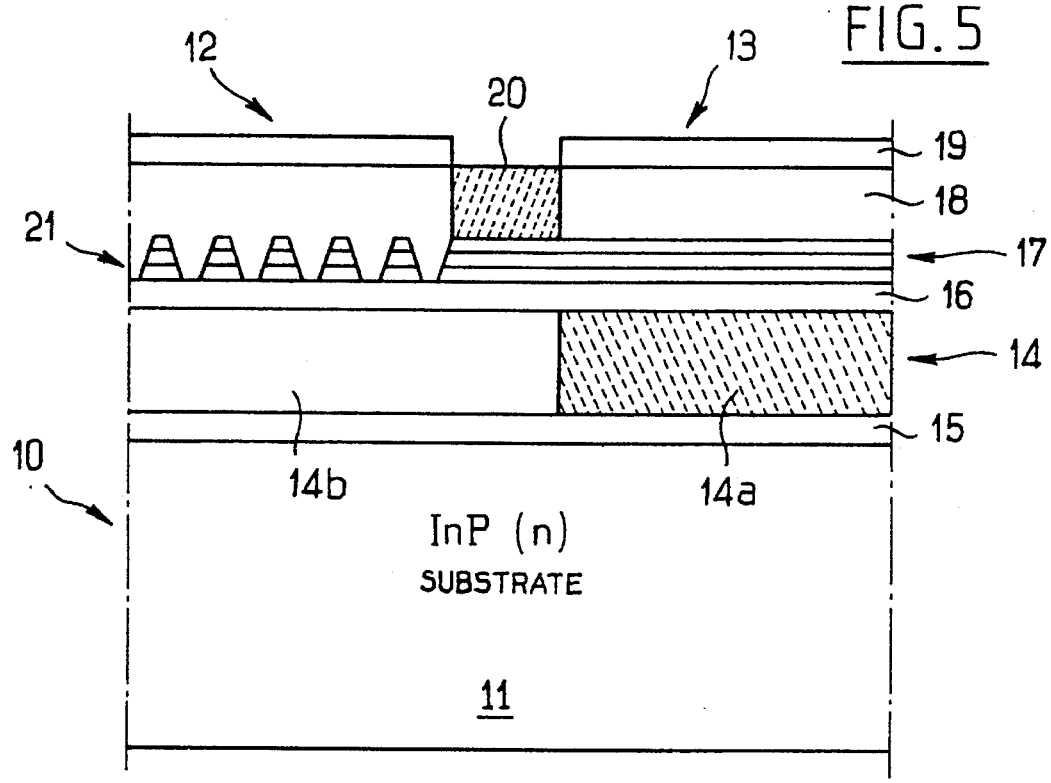
FIG. 5 is a diagram of a component having integrated laser and modulator functions and made by implementing the method of the invention.

The invention applies in general manner to all quantum well heterostructures based on III/V materials, such as heterostructures of the following types: GaAs/(Ga)AlAs, InGaAs/Ga(Al)As on GaAs substrates, and InGaAs/InP, InGaAs/InGaAsP, $(InGaAsP)_1/(InGaAsP)_2$, or InGaAs/In(Ga)AlAs on InP substrates.

In FIGS. 1a to 1e, reference 1 designates the substrate of such a heterostructure, and reference 2 designates its quantum well layers.

Once the quantum well layers 2 have been grown on the substrate 1 in application of conventional techniques (FIG. 1a), a layer 3 of doped dielectric material is deposited on the quantum well layers 2 (FIG. 1b).

In accordance with the invention, the nature and the degree of the doping of the dielectric layer 3, and also its thickness are chosen in a manner explained in greater detail below so as to control activation or blocking of the transformation of the quantum well layers during subsequent heat treatments.

Deposition may be obtained, for example, by plasma-assisted chemical deposition. Conventional photolithographic and etching techniques make it possible to obtain deposits of desired shapes.

Once the deposit has been made, the sample obtained in this way is heat treated by subjecting it to a given annealing temperature for a length of time that is determined as a function of the desired forbidden band energy shift.

The two types of annealing used are rapid annealing by means of halogen lamps, and conventional annealing by the Joule effect. Rapid annealing is characterized by very short temperature rise times, of the order of 10 seconds to reach 850° C. (i.e. about 100° C. per second) followed by pausing at the heat treatment temperature for a period of 0 to a few tens of seconds. Conventional annealing has rise times of about 5 minutes with pauses at high temperature of 0 to several tens of minutes.

Annealing is performed in open tubes (not sealed tubes) under a flow of argon with 10% hydrogen.

As shown in FIGS. 1c and 1d which corresponds to two particular shapes of deposit, forbidden band energy shifts appear in those regions of the quantum well layers 2 on which the layer 3 has been deposited (regions 4a), while the other regions (regions 4b) retain their initial properties.

The dielectric material of the layer 3 is advantageously $SiO_x$ containing a dopant that has been deliberately inserted therein.

By way of example, the $SiO_x$ dielectric layer is doped by inserting an isoelectronic element (or dopant), i.e. an element belonging to column III, such as boron (B), aluminum (Al), indium (In), or gallium (Ga), or else to column V, such as phosphorus (P), arsenic (As), or nitrogen (N), thereby obtaining transformation without inserting free carriers into the quantum well heterostructure. If it is desired to obtain transformed regions that have free carriers present therein, then in addition to the dielectric doping, doping is performed with an electrically active dopant or element such as silicon (Si, column IV) or sulfur (S, column VI) as an n-type donor dopant, or such as zinc (Zn, column II) or magnesium (Mg, column II) as a p-type acceptor dopant.

After heat treatment, the method can be finished off by a stage in which the component is finalized by additional conventional epitaxial growth.

FIG. 1e shows one possible implementation of the method of the invention making it possible to obtain, on a common quantum well medium, a plurality of juxtaposed regions 5a and 5b which are blocked or not blocked and which have different forbidden band energy shifts. In this implementation, a first dielectric layer 3 is deposited on one or more regions (regions 5a) of the heterostructure. The dielectric layer 3 is covered with a second dielectric layer 6, as are other regions of the heterostructure that are not covered by the first dielectric layer 3 (region 5b), and then the entire sample is subjected to heat treatment. The respective materials, thicknesses, and dopings of the dielectric layers 3 and 6 are chosen as a function of the desired forbidden band energy shifts for the regions 5a and 5b respectively. In particular, one of the dielectric layers could be selected to block transformation of the heterostructure region on which it is deposited. An example of a blocking dielectric is simply non-doped SiOx or SiOx containing an isoelectronic element such as nitrogen (N).

In a variant, and advantageously, it is also possible to make a first dielectric deposit that is annealed and etched so as to be removed locally, followed by second annealing and further local etching, said steps being repeated so as to obtain in controlled manner different degrees of localized transformation on a common quantum well medium.

As will have been understood, this method makes it possible in general manner to form different electro-optical and/or photonic functions that may be discrete or integrated on a common multi-quantum-well medium. In particular, it is possible to make buried laser components, waveguides, pixelizations for vertical cavity photonic components, integrated laser-modulator-waveguide components, multiple emission layers, couplers, or lateral heterostructure electron injection zones (n-type or p-type) for vertical cavity electronic components or for lateral bipolar transistors.

The way in which the resulting forbidden band energy shift varies as a function of the heat treatment performed, and also of the level of doping, and of the thickness of the dielectric layer on various types of quantum well heterostructures is now described.

FIGS. 2a to 2d show the forbidden band energy shift obtained for four main types of quantum well after heat treatment at 850° C., as a function of the square root of the duration of the heat treatment. In all of the cases, the deposited dielectric layer is a layer of $SiO_x$ doped with phosphorous to a concentration of $3\_10^{21} cm^{-3}$ and having a thickness of about 200 nm. The energy shift is plotted up the ordinate and it is given in millielectron-volts. The square root of the annealing time of the heat treatment is plotted along the abscissa and is given in min_ or in s_.

The example of FIG. 2a corresponds to a GaAs/GaAlAs ($GaAs/Ga_{0.65}Al_{0.35}As$) multi-quantum-well heterostructure deposited to a GaAs substrate, the quantum wells and barriers being respectively 7.8 nm and 8.4 nm thick, and the heterostructure comprising 40 individual unit stacks or "periods".

The example of FIG. 2b corresponds to an InGaAs/InAlAs ($In_{0.53}Ga_{0.47}As/In_{0.52}Al_{0.48}As$) multi-quantum-well heterostructure deposited on an InP substrate, the quantum wells and barriers being 5 nm thick, the heterostructure possessing 50 unit stacks or periods.

The example of FIG. 2c corresponds to an InGaAs/InP ($In_{0.53}Ga_{0.47}/InP$) quantum well heterostructure deposited on an InP substrate, with quantum wells and barriers that are 9.5 nm thick, the heterostructure having 20 unit stacks.

The example of FIG. 2d corresponds to an $(InGaAsP)_1/(InGaAsP)_2$ multi-quantum-well heterostructure having respective thicknesses of 8 nm and of 18 nm, and deposited on an InP substrate, the heterostructure having five unit stacks.

For example, by using graphs of the type shown in FIGS. 2a to 2d as reference curves for a tested medium, it is possible to act on the duration of the heat treatment to control the forbidden band energy shift for a dielectric deposit of given doping and thickness, and for a heat treatment temperature that is also given.

The forbidden band energy shift is also controlled by the thickness of the dielectric deposit. FIG. 3 shows the shift measured for the heterostructure of FIG. 2a as a function of the thickness of the dielectric deposit, in the case of heat treatment by conventional annealing at 850° C. The dielectric material and the doping thereof are identical to those used for establishing the graph of FIG. 2a.

For example, by using this type of graph as a guide, it is possible to act on the thickness of the dielectric deposit to control the resulting forbidden band energy shift for a dielectric deposit of given thickness and for heat treatment at a temperature and for a duration that are also given.

Reference is now made to FIG. 4 which shows how the forbidden band energy shift varies as a function of the concentration of dopant in the dielectric layer. The tested heterostructure has five unit stacks of InGaAs (4.5 nm)/InGaAsP (21 nm). The dielectric material and the doping element are the same as those used for establishing the graphs of the preceding figures. Heat treatment was rapid annealing at 850° C.

From FIG. 4 it can be seen that the forbidden band energy shift increases with increasing concentration of dopant. In the method of the invention, the energy shift of the forbidden that is achieved is controlled by adjusting the concentration of the dopant, e.g. by using a graph of the type shown in FIG. 4 and corresponding to the tested structure.

Reference is now made to FIG. 5 which is a diagram of a monolithic component 10 on which two active functions have been integrated. The component 10 includes, in particular, on a common substrate 11, an active zone 12 performing a laser emission function and an active zone 13 having an electro-optical modulator function.

The substrate 11 is an InP substrate.

The structure treated by the method of the invention is constituted by a layer 14 of five unit stacks $(InGaAsP)_1$ (8 nm)/(InGaAsP)$_2$ (18 nm) deposited on a 1.5 μm thick layer 15 of InGaAsP carried by the substrate 11 and acting as an optical confinement cavity. A confinement layer 16 similar to the layer 15 is deposited on the layer 14 after treatment by the method of the invention.

To implement the modulator function 13, an activating layer of doped SiO$_x$ is deposited on the portion of the layer 14 that corresponds to said modulator (portion 14a), while the other portion 14b of the layer 14 is covered with a blocking layer of non-doped SiO$_2$. The SiO$_x$ is doped by inserting phosphorous to a concentration of $3\_10^{21}\text{cm}^{-3}$. The sample obtained in this way is heat treated at 850° C. for a duration of 7 s.

After the heat treatment, the layers 17 are deposited, and then using techniques that are conventional for the person skilled in the art, a grating 21 is made for the distributed feedback (DFB) laser. The component is then finished off by further epitaxial growth of p-doped layers comprising at least an InP layer 18 and an InGaAs contact layer 19. Electrical isolation or separation 20 of the contact layers for the modulator 13 and for the laser 12 is achieved by bombarding protons into the layer 18.

The characteristics of the laser and modulator functions of the component obtained in this way have been tested.

Figure 6:
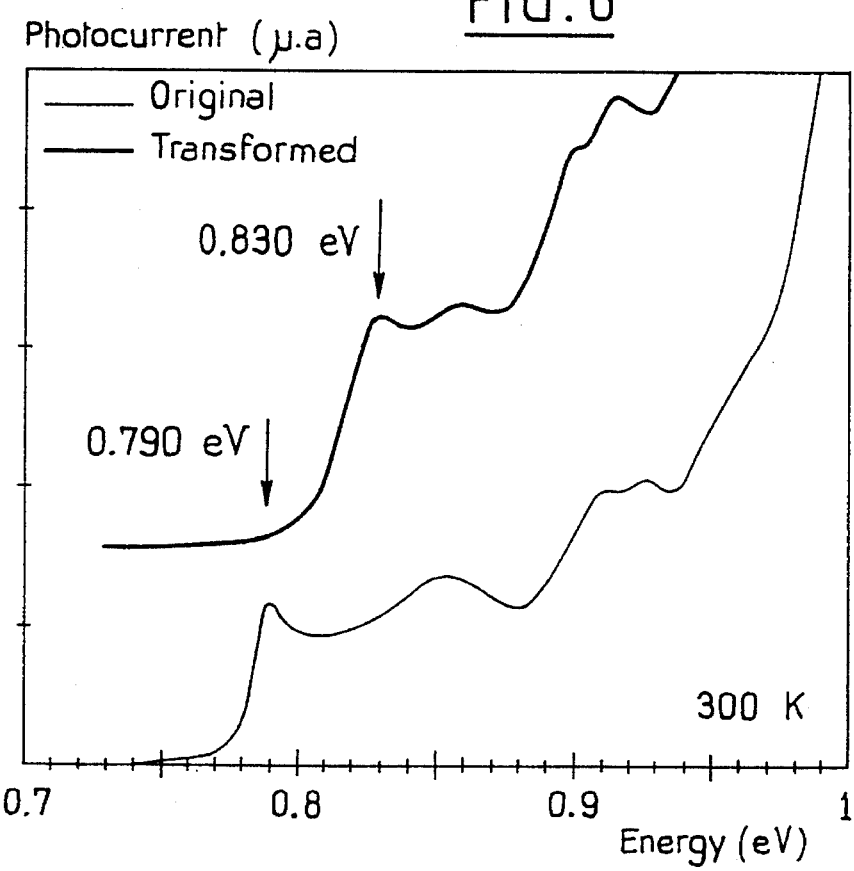
FIG. 6 is a graph on which the photocurrent characteristics of the integrated modulator of the FIG. 5 component are plotted as a function of the energy of incident photons.

FIG. 6 is a graph in which photocurrent curves are plotted relating to the transformed region 14a both before and after heat treatment. It can be seen that the heterostructure retains its excitonic nature: the transformed region 14a has a sharp absorption front at 0.830 eV, which property is necessary to make optimum operation of the modulator possible.

The exciton absorption front of the non-transformed region corresponds to a laser emission wavelength of 1.5507 μm (FIG. 7).

FIG. 8 shows the light power (in mW) output by the modulator 13 as a function of the current controlling the laser 12, for different reverse voltages applied to said modulator 13. The laser threshold current is unaffected and remains low (15 mA).

Measurements of optical transmission as a function of the reverse voltage applied to the modulator 13 are plotted in FIG. 9 and show an extinction rate of 15 dB for a tension of 4 volts.

As will be understood, the invention makes it possible to simplify monolithic integration of electronic and photonic components. The method proposed by the invention makes such integration possible in a "planar" manner that is reproducible and controlled, on all types of quantum well media (strained or otherwise) and based on III/V materials.

The invention presents the major advantage of enabling transformation of the quantum well medium to be controlled over a wide range of energy shifts, thereby making it possible to fabricate components that are active (moderate shift) and components that are passive (large shift), and combinations thereof. The method makes it possible to conserve the crystal and optical properties of the transformed medium.

What is claimed is:

1. A method of making a component presenting at least one integrated electro-optical or photonic function, in which at least one dielectric layer is deposited on a quantum well layer based on III/V materials, and in which the resulting sample is heat treated, wherein the dielectric layer is a layer of doped SiO$_x$ where x lies in the range (0,2), and wherein the thickness of said layer, the nature and the concentration of its doping, and the conditions of the heat treatment are selected in such a manner as to shift the forbidden band energy of that region of the quantum well layer on which the dielectric layer is deposited to confer on said region electro-optical or photonic properties that correspond to said function.

2. A method according to claim 1, wherein the quantum well layer is of the type based on GaAs and on InP.

3. A method according to claim 2, wherein the quantum well layer is of one of the following types: GaAs/GaAlAs; InGaAs/Ga(Al)As; InGaAs/InAlAs; InGaAs/InP; and InGaAs(P)/InGaAsP.

4. A method according to claim 1, wherein the doping of the dielectric layer is isoelectronic.

5. A method according to claim 4, wherein the isoelectronic doping of the dielectric layer is accompanied by additional n-type doping.

6. A method according to claim 4, wherein the isoelectronic doping of the dielectric layer is accompanied by p-type additional doping.

7. A method according to claim 1, wherein dielectric layers are deposited on at least two regions of the quantum well layer, which layers are heat treated in different manners or are of different materials or thicknesses or doping.

8. A method according to claim 7, wherein at least one of said two dielectric layers blocks transformation of the region on which it is deposited.

9. A method according to claim 8, wherein the layer which blocks transformation of the region on which it is deposited is a layer of SiO$_2$ that is not doped or that is doped with nitrogen.

10. A method according to claim 7, including the following different steps:

depositing a dielectric layer;

locally etching the dielectric layer; and controlled heat treatment; and wherein the above steps are repeated one or more times so as to obtain different degrees of transformation localized on the quantum well layer.

11. A method according to claim 7 for making a monolithic component presenting a plurality of integrated electro-optical or photonic functions.

* * * * *

UNITED STATES PATENT AND TRADEMARK OFFICE
CERTIFICATE OF CORRECTION

PATENT NO. : 5,525,541
DATED      : June 11, 1996
INVENTOR(S) : Krauz et al.

It is certified that an error appears in the above-identified patent and that said Letters Patent is hereby corrected as shown below:

In column 3 at line 22, please delete " E " and insert -- x --.

Signed and Sealed this

Twenty-ninth Day of October 1996

Attest:

BRUCE LEHMAN

*Attesting Officer*   *Commissioner of Patents and Trademarks*